(12) United States Patent
Coulson et al.

(10) Patent No.: US 7,222,052 B2
(45) Date of Patent: May 22, 2007

(54) TEMPERATURE ADAPTIVE FERRO-ELECTRIC MEMORY ACCESS PARAMETERS

(75) Inventors: Richard L. Coulson, Portland, OR (US); Jonathan C. Lueker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/877,914

(22) Filed: Jun. 25, 2004

(65) Prior Publication Data

US 2005/0288902 A1    Dec. 29, 2005

(51) Int. Cl.
*G06F 11/30*    (2006.01)
(52) U.S. Cl. ...................................................... 702/186
(58) Field of Classification Search ............... 702/186, 702/182, 211, 200, 52, 145; 365/145, 211, 365/200, 52; 455/75
See application file for complete search history.

(56) References Cited

U.S. PATENT DOCUMENTS

| | | | |
|---|---|---|---|
| 5,798,961 A * | 8/1998 | Heyden et al. | 365/52 |
| 6,829,190 B1 * | 12/2004 | Snyder et al. | 365/211 |
| 6,865,101 B2 * | 3/2005 | Iwanari | 365/145 |
| 2003/0063499 A1 * | 4/2003 | Gudesen et al. | 365/200 |
| 2004/0141370 A1 * | 7/2004 | Tran et al. | 365/158 |
| 2005/0003767 A1 * | 1/2005 | Song | 455/75 |
| 2005/0073869 A1 * | 4/2005 | Gudesen et al. | 365/145 |

\* cited by examiner

*Primary Examiner*—John Barlow
*Assistant Examiner*—Xiuqin Sun
(74) *Attorney, Agent, or Firm*—Cyndi M. Wheeler

(57) ABSTRACT

Briefly, one or more memory access parameters used to access a memory cell are adjusted based on a sensed operating temperature. In one embodiment, a pulse width of an access voltage is increased as the operating temperature decreases below a threshold. In another embodiment, a drive voltage is decreased as the operating temperature increases.

22 Claims, 5 Drawing Sheets

TEMPERATURE ADAPTIVE FERRO-ELECTRIC MEMORY ACCESS PARAMETERS

BACKGROUND

Description of the Related Art

In some memories, operation requirements, for example, a voltage level needed to access a cell, may change with temperature. In order to improve memory performance, system designers are continually searching for alternate ways to access memories under a wide range of temperatures.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

In the following description, numerous specific details are set forth. However, it is understood that embodiments of the invention may be practiced without these specific details. In other instances, well-known methods, structures and techniques have not been shown in detail in order not to obscure an understanding of this description.

References to "one embodiment," "an embodiment," "example embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

In the following description and claims, the terms "include" and "comprise," along with their derivatives, may be used, and are intended to be treated as synonyms for each other. In addition, in the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Unless specifically stated otherwise, as apparent from the following discussions, it is appreciated that throughout the specification discussions utilizing terms such as "processing," "computing," "calculating," or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data from registers and/or memory to transform that electronic data into other electronic data that may be stored in registers and/or memory. A "computing platform" may comprise one or more processors.

In the following description and claims, the term "data" may be used to refer to both data and instructions. In addition, the term "information" may be used to refer to data and instructions.

Figure 1:
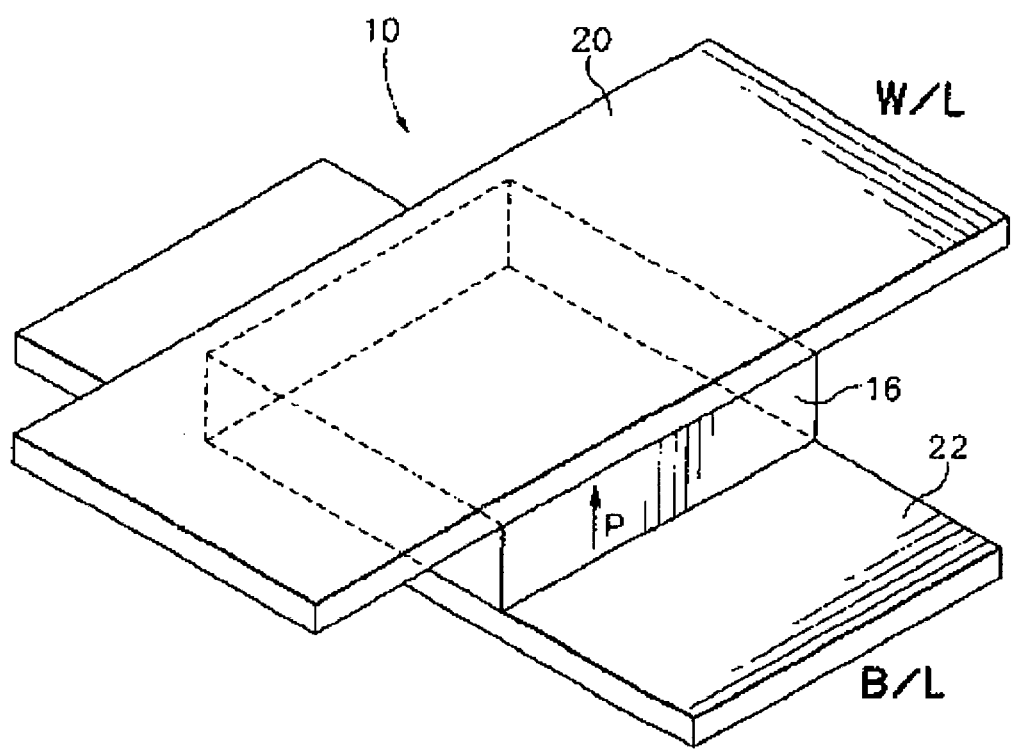
FIG. 1 illustrates a diagram illustrating a portion of one type of a ferroelectric memory cell according to an embodiment of the present invention.

FIG. 1 is a diagram illustrating a portion of one type of a ferroelectric memory cell 10 that may be used in embodiments of the present invention. Ferroelectric memory is a type of non-volatile memory that utilizes the ferroelectric behavior of certain materials to retain data in a memory device in the form of positive and negative polarization, even in the absence of electric power. A ferroelectric material 16 may contain domains of similarly oriented electric dipoles that retain their orientation unless disturbed by some externally imposed electric force. The polarization of the material characterizes the extent to which these domains are aligned. The polarization can be reversed by the application of an electric field of sufficient strength and polarity.

Ferroelectric material 16 may be a ferroelectric polymer polarizable material, and may also be referred to as a ferroelectric polarizable material or a dipole ferroelectric material. In various embodiments, the ferroelectric polymer material may comprise a polyvinyl fluoride, a polyethylene fluoride, a polyvinyl chloride, a polyethylene chloride, a polyacrylonitrile, a polyamide, copolymers thereof, or combinations thereof. Another example of a ferroelectric material may include a ferroelectric oxide material.

Ferroelectric material 16 having a polarization P may be located between a conductive word line (W/L) 20 and a conductive bit line (B/L) 22. An electric field may be applied to the ferroelectric cell by applying an electric potential (voltage) between word line 20 and bit line 22 so as to effect changes in the polarization of ferroelectric material 16.

Figure 2:
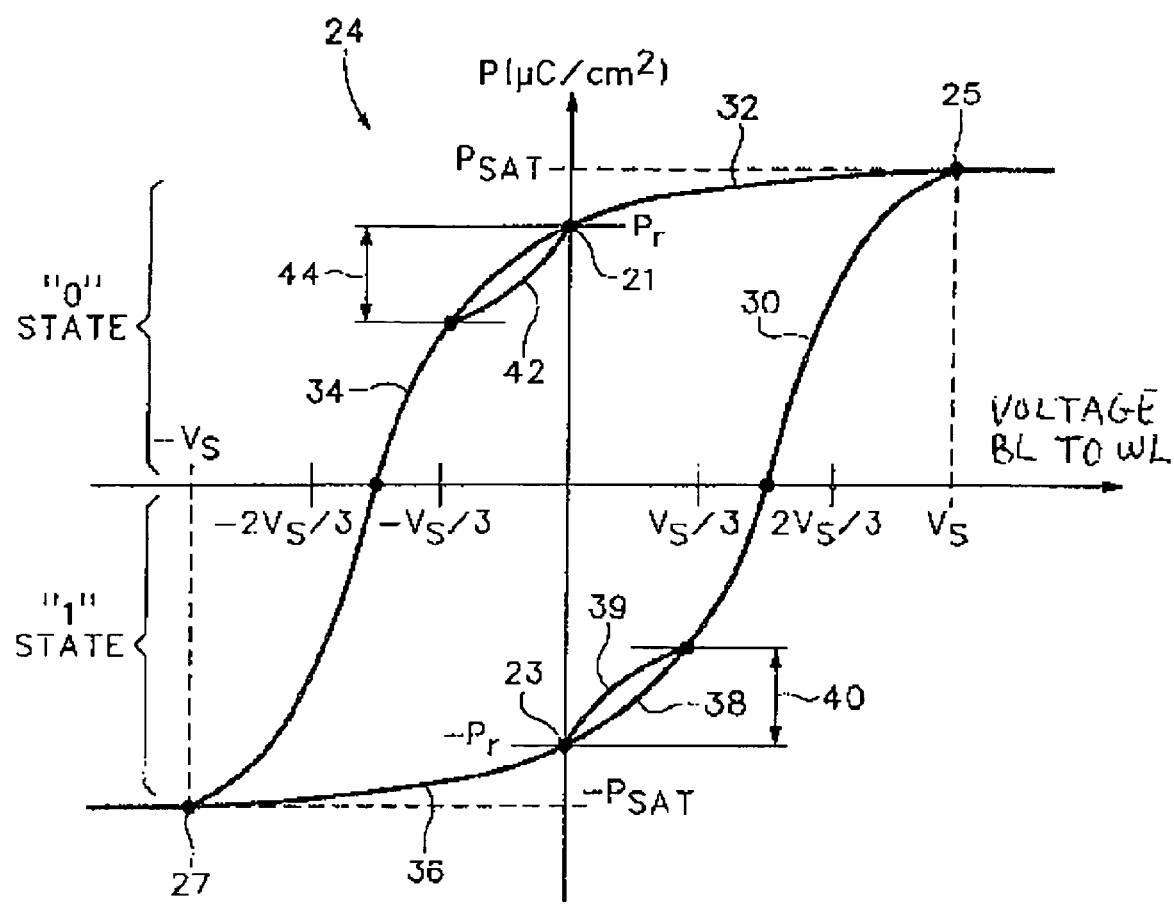
FIG. 2 is a graph of the polarization versus voltage properties of a ferroelectric cell according to an embodiment of the present invention.

FIG. 2 shows a simplified hysteresis curve 24 that illustrates idealistically the polarization versus voltage properties of the ferroelectric cell of FIG. 1. When a positive voltage (e.g., $V_{bit\ line} - V_{word\ line} > 0$) of sufficiently large magnitude (shown here, for example, as Vs) is applied to the cell, all of the domains in the cell are forced to align, to the extent possible, in the positive direction, and the polarization P reaches the saturation polarization Psat at point 25 on the curve. A further increase in the voltage produces no further increase in the polarization because all of the domains are already aligned as far as possible in the direction of the electric field produced by the voltage between the word line and bit line. In one example, a positive voltage may be applied by applying Vs, for example, about 12 volts, to bit line 22 and applying about zero volts to word line 20. In another example, two non-zero positive voltages may be applied to bit line 22 and word line 20 to generate a positive voltage across material 16. Note that the voltages applied may very with specific implementations and the scope of the present invention is not limited in this respect.

If the voltage is then reduced to zero (following path 32 to arrive at point 21), some of the domains switch their orientation (also referred to as rotating, flipping or reversing), but most of the domains retain their orientation. Thus, the ferroelectric material retains a remnant polarization Pr.

For purposes of data storage, ferroelectric cell 10 is considered to be in the logic "0" (zero) state when the polarization P is positive (preferably at Pr), and the logic "1" (one) state when the polarization is negative (preferably at −Pr). The assignment of a logic "1" or logic "0" to a positive or negative polarization is arbitrary, and in other embodiments, opposite conventions may be used.

If a negative voltage of sufficiently large magnitude (shown here, for example, as −Vs) is then applied to the word line 20 relative to bit line 22 (following path 34 to point 27), all of the domains are forced to switch their orientation, and the polarization reaches the negative saturation level −Psat. Removing this negative voltage (following path 36 to point 23) allows some of the domains to switch, and the cell polarization reaches the negative remnant polarization −Pr. If the positive voltage Vs is again applied to the cell (following path 30 to point 25), the domains once again switch their orientation, and the cell takes on the positive saturation polarization Psat until the voltage is removed, and the polarization reaches the positive saturation level +Pr.

Ferroelectric materials also exhibit resilience, wherein a ferroelectric cell may return close to its remnant polarization despite a small disturbance. During an access cycle, bit lines and word lines of neighboring cells may be driven with voltages that provide quiescent level electric fields across the neighboring ferroelectric cells. Quiescent level voltages may be defined in accordance with the resilient qualities of the ferroelectric cell, wherein polarization disturbances of the cells are kept within a recovery range. For example, in accordance with one embodiment of the present invention, the quiescent level, also referred to as a disturb voltage threshold, may be set to a magnitude no greater than ⅓ the switching level voltage. For example, assuming a one state storage condition for a ferroelectric cell, as represented by remnant polarization position 23 of hysteresis curve 24, a small voltage disturbance of Vs/3 may provide a small polarization shift 40 along path 38. However, once the voltage is removed, a large portion of the domains of the ferroelectric cell may realign their orientations to that of the cell's overall orientation, as illustrated by return path 39 of hysteresis curve 24. Note that the return path may not return to position 23 but to a point slightly above position 23. Many small voltage disturbances may accumulate overtime, moving the storage condition along path 38 and affecting memory performance. Large voltage disturbances, for example, when the voltage is greater than Vs/3, may move the charge of the cell significantly closer to position 25 along path 30 of hysteresis curve 24. Additionally, a large negative voltage disturbance, for example, a voltage of −2Vs/3, may move the charge of the cell significantly closer to position 27 along path 34 of hysteresis curve 24. It is desirable to keep voltage disturbances to a minimum, and below Vs/3. Thus, there may be only a narrow operating window in which the drive voltage is sufficiently high and in which the disturb voltage of Vs/3 is sufficiently low.

Figure 3:
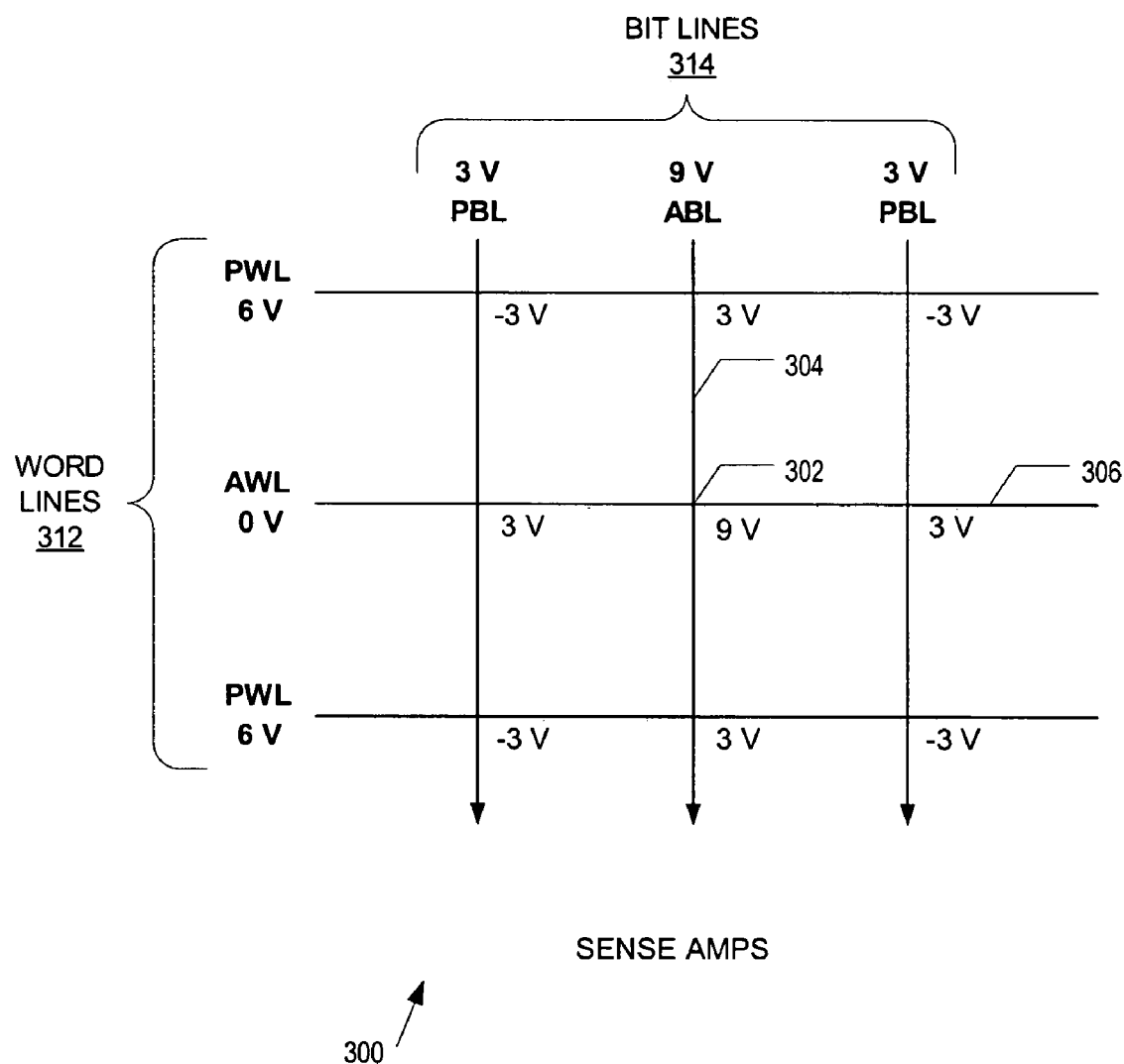
FIG. 3 is a block diagram of a ferroelectric memory device according to an embodiment of the present invention.

FIG. 3 is a block diagram illustrating a ferroelectric memory device 300 in accordance with an embodiment of the present invention. Memory device 300 includes a cross-point passive matrix memory array having word lines 312 that cross bit lines 314. Ferroelectric material such as, for example, a ferroelectric polymer material, may be disposed between the word lines and bit lines to form ferroelectric cells at the intersections of word lines and bit lines. For example, a ferroelectric cell 302 is located at the crossing of the word line identified as 306 and the bit line identified as 304 in FIG. 3. In this example, cell 302 is referred to as "active" because it identifies a specific cell that has been selected to read or write. The word line coupled to the active cell is identified as an active word line (AWL), whereas the remaining word lines are passive word lines (PWL). Likewise, the bit line coupled to the active cell is identified as the active bit line (ABL), whereas the remaining bit lines are passive bit lines (PBL). Passive word lines and bit lines may also referred to as unselected word lines and bit lines. Active word lines and bit lines may also be referred to as selected, addressed, or target word lines and bit lines.

When accessing an active cell, an access or switching level voltage may be applied to the active bit line 304. The access level voltage has a magnitude that is defined as $(V_{bitline} - V_{wordline})$, and is sufficient to effect a polarization reversal of the active cell 302. As illustrated, the access level voltage has a magnitude of 9 Volts (V), obtained by applying 9 V to bit line 304 and 0 V to word line 306. In order to keep disturb voltages below the disturb voltage threshold of Vs/3, voltages are applied to the passive bit and word lines. As illustrated, 3 V is applied to the passive bit lines and 6 V is applied to the passive word lines, resulting in voltages of 3 V, and −3 V being applied to neighboring cells. Thus, only the active cell is written, wherein application of the access level voltage may switch the cell's polarization state.

Temperature may also affect cell performance. The hysteresis curve 24 may shift along the voltage axis with temperature. For example, hysteresis curve 24 may contract along the voltage axis at higher temperatures. Thus, the drive voltage required to switch the cell to, for example, position 25, is lower. Likewise, the disturb voltage threshold is lower. Additionally, hysteresis curve 24 may expand along the voltage axis at lower temperatures where the drive voltage required and the disturb voltage threshold is higher. Thus, the narrow operating window in which the drive voltage is sufficiently high, but in which the disturb voltage of Vdrive/3 is sufficiently low varies with operating temperature.

Control circuit technology may also affect cell performance. Certain technologies, for example, Complementary Metal Oxide Semiconductor (CMOS) technology, are limited in the amount of voltage that can be supplied before breakdown occurs. Further, the amount of voltage that can be supplied may vary with temperature. For example CMOS control circuitry may be able to supply, for example, 14 V at room temperature, but can only supply 12.5 V at zero degrees Celsius. Thus, a ferroelectric cell operating at very low temperatures requires a high amount of drive voltage at the same time that CMOS control circuitry is at its lowest voltage output capability.

According to an embodiment of the present invention, increasing the amount of time a voltage is applied to a cell has the same effect as applying a higher voltage for a shorter period of time. For example, in one embodiment of the present invention, with a pulse width of approximately 50 microseconds, doubling the pulse width may provide a similar polarization result as applying an additional 0.7 V. Thus, an 8× pulse width may provide the equivalent of an additional 2.1V of drive voltage. Note that the pulse width and effective voltage varies with specific implementation and the scope of the present invention is not limited in this respect.

According to an embodiment of the present invention, access parameters, for example, a drive voltage and/or a pulse width, is adjusted according to temperature, such that enough voltage is applied to the cell without creating a voltage greater than the disturb voltage threshold on neighboring cells.

Figure 4:
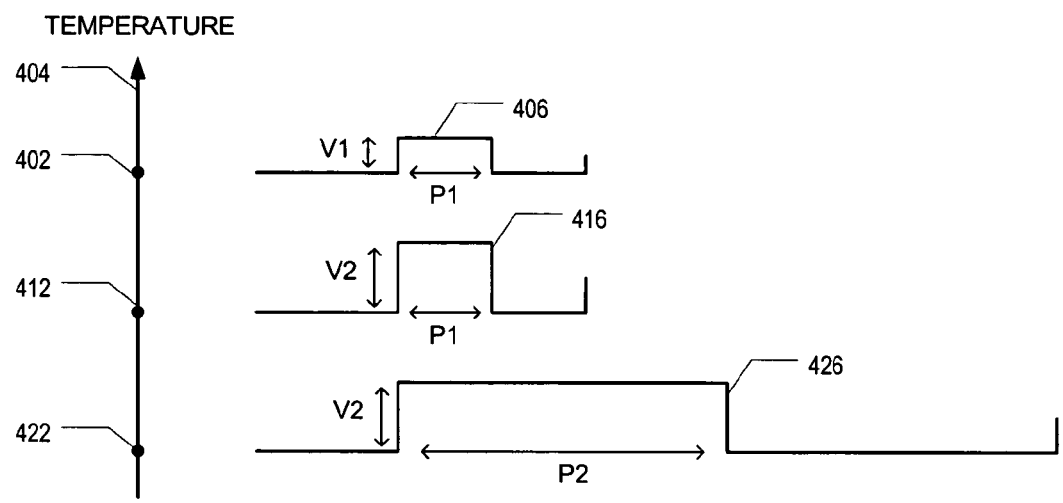
FIG. 4 illustrates multiple access diagrams across a range of temperatures according to an embodiment of the present invention.

FIG. 4 illustrates multiple access diagrams across a range of temperatures according to embodiments of the present invention. At higher temperatures, for example, at position 402 on the temperature axis 404, an access diagram 406 used to access a cell, for example, to read or write the cell, has a drive voltage of V1 and a pulse width of P1. At an intermediate temperature, for example, at position 412 on temperature axis 404, an access diagram 416 has a drive voltage of V2 and a pulse width of P1, where V2 is greater than V1. At a lower temperature, for example, at position 422 on temperature axis 404, an access diagram 426 has a drive voltage of V2 and a width of P2, where P2 is greater than P1. Thus, at higher temperatures, a lower drive voltage may be used to access a memory cell. At lower temperatures, a wider pulse width may be used to access the memory cell. Either or both of these techniques or other techniques may be used according to embodiments of the present invention.

Figure 5:
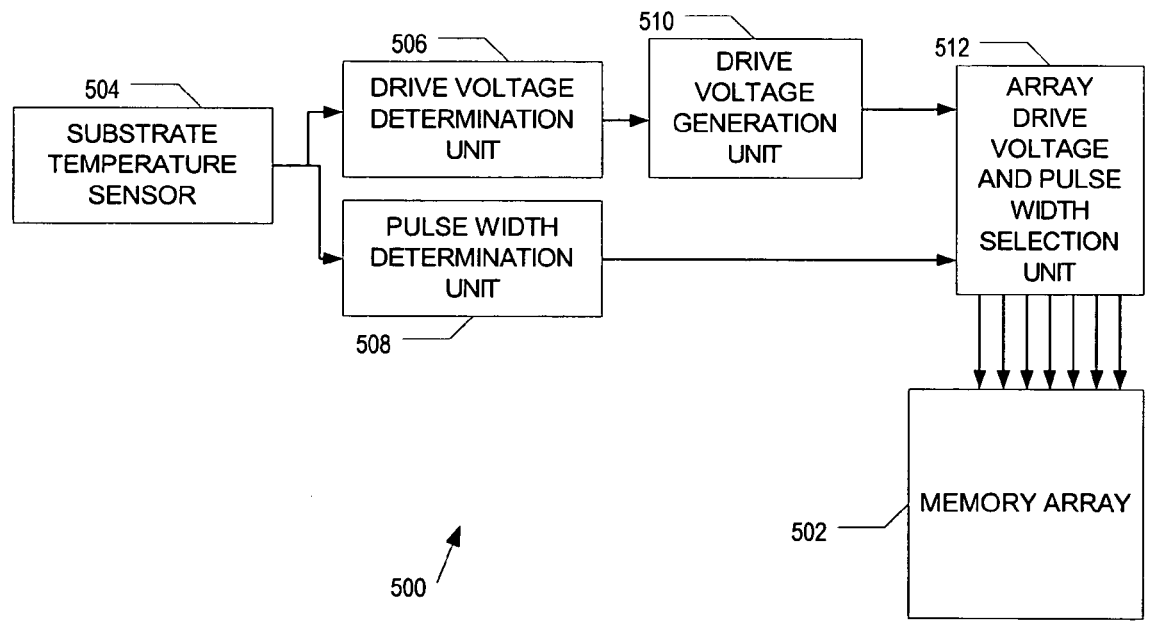
FIG. 5 illustrates a memory system according to an embodiment of the present invention.

FIG. 5 illustrates a memory system according to an embodiment of the present invention. Memory system 500 includes a ferroelectric memory array 502. Memory array 502 may be any size, for example, 17,000 bit lines and 8,000 word lines. In some embodiments, memory array 502 may be partitioned or segmented into subarrays.

Memory system 500 also includes a temperature sensor 504 for sensing the operational temperature of memory array 502. Temperature sensor 504 provides sensed temperature information to a drive voltage determination unit 506 and a pulse width determination unit 508. Each determination unit may include a look up table or a calculation function. For example, voltage determination unit 506 may include a lookup table with multiple entries of drive voltages associated with a plurality of temperatures. Alternatively, drive voltage determination unit 506 may include a calculation unit to calculate an optimum drive voltage for a given temperature. Pulse width determination unit 508 may include a lookup table with multiple entries of pulse widths associated with a plurality of temperatures. Alternatively, pulse width determination unit 508 may include a calculation unit to calculate an optimum pulse width for a given temperature.

In an alternate embodiment, a single lookup table includes drive voltage and pulse width pairs that are selected according to a sensed operational temperature.

Drive voltage determination unit 506 provides the determined drive voltage information to a drive voltage generation unit 510 to generate the optimum drive voltage. The optimum drive voltage and optimum pulse width information is provided to an array drive voltage and pulse width selection unit 512 which provides access controls to memory array 502.

Various embodiments may be optimized according to expected operational temperatures or other operational constraints. For example, in one embodiment, of memory system 500, pulse width is fixed and only drive voltage varies according to temperature. In another embodiment of memory system 500, drive voltage is fixed and only pulse width varies according to temperature. In yet another embodiment of memory system 500, both drive voltage and pulse width vary according to temperature.

Figure 6:
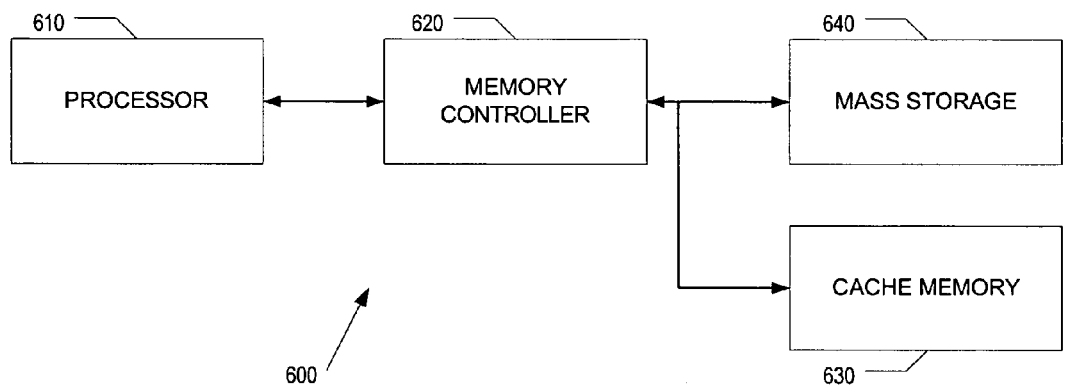
FIG. 6 is a block diagram illustrating a portion of a computing system according to an embodiment of the present invention.

Turning to FIG. 6, shown is a block diagram of a computing system 600 in accordance with an embodiment of the present invention. As shown in FIG. 6, in one embodiment computing system 600 may include a processor 610, a memory controller 620, a cache memory 630, and a mass storage 640. Processor 610 may be a general-purpose or special-purpose processor such as a microprocessor, microcontroller, application specific integrated circuit (ASIC), a programmable gate array (PGA), or the like.

In one embodiment, cache memory 630 may be a relatively large non-volatile disk cache memory adapted to cache information for mass storage 640. For example, cache memory 630 may be a ferroelectric polymer memory. Mass storage 640 may be a mass storage device such as, for example, a disk memory having a storage capacity of 512 Mbytes, although the scope of the present invention is not limited in this respect. Mass storage 640 may be an electromechanical hard disk memory or an optical disk memory, although the scope of the present invention is not limited in this respect. In one embodiment, cache memory 630 may have a storage capacity of at least about 500 megabytes and may include ferroelectric memory cells, wherein each cell includes a ferroelectric polymer material located between at least two conductive lines. The ferroelectric polymer material may be a ferroelectric polarizable material. In various embodiments, the ferroelectric polymer material may comprise a polyvinyl fluoride, a polyethylene fluoride, a polyvinyl chloride, a polyethylene chloride, a polyacrylonitrile, a polyamide, copolymers thereof, or combinations thereof.

In an alternate embodiment, cache memory 630 may be another type of plastic memory such as, for example, a resistive change polymer memory. In this embodiment, the plastic memory may include a thin film of polymer memory material sandwiched at the nodes of an address matrix. The resistance at any node may be altered from a few hundred ohms to several megohms by applying an electric potential across the polymer memory material to apply a positive or negative current through the polymer material to alter the resistance of the polymer material. Potentially different resistance levels may store several bits per cell and data density may be increased further by stacking layers.

The memory of the apparatus may be a ferroelectric polymer memory, a ferroelectric oxide memory, or any other ferroelectric memory, although the scope of the present invention is not limited in this respect. In alternate embodiments, the memory may also be a non-ferroelectric memory.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A method comprising:
   sensing an operating temperature of a memory device; and
   adjusting one or more memory access parameters according to the operating temperature of the memory device; and
   writing at least one cell of the memory device using the one or more memory access parameters;
   wherein adjusting the one or more memory access parameters comprises decreasing a magnitude of a drive voltage applied to the at least one cell as the operating temperature increases above a threshold temperature.

2. The method as recited in claim 1, wherein the one or more memory access parameters comprise a pulse width of the drive voltage applied to the at least one cell.

3. The method as recited in claim 1, wherein the adjusting the one or more memory access parameters further comprises increasing a pulse width of the drive voltage applied to the at least one cell as the operating temperature decreases.

4. The method as recited in claim 1, wherein adjusting the one or more memory access parameters further comprises:
   accessing a table of drive voltage listings;
   selecting one of the drive voltage listings using the operating temperature sensed.

5. The method as recited in claim 1, wherein adjusting the one or more memory access parameters further comprises:
   accessing a table of drive voltage and pulse width pairs;
   selecting one of the drive voltage and pulse width pairs using the operating temperature sensed.

6. The method as recited in claim 1, wherein the adjusting the one or more memory access parameters further comprises preventing a disturb voltage on neighboring cells from exceeding a disturb voltage threshold.

7. A method comprising:
   sensing an operating temperature of a memory device; and
   adjusting one or more memory access parameters according to the operating temperature of the memory device; and
   reading at least one cell of the memory device using the one or more memory access parameters;
   wherein adjusting the one or more memory access parameters comprises adjusting a magnitude of a drive voltage applied to the at least one cell;
   wherein the one or more memory access parameters is a read voltage applied to read a polarity of the at least one cell, wherein to read the polarity comprises:
   applying the read voltage across the at least one cell for a read pulse time; and determining the amount of charge released from the at least one cell to determine the logic state of the information stored in the at least one cell.

8. A method comprising:
   sensing an operating temperature of a memory device; and
   adjusting one or more memory access parameters according to the operating temperature of the memory device; and
   writing at least one cell of the memory device using the one or more memory access parameters;
   wherein adjusting the one or more memory access parameters comprises adjusting a magnitude of a drive voltage applied to the at least one cell;
   wherein the one or more memory access parameters is a write voltage applied to write a polarity of the at least one cell, wherein to write the polarity comprises:
   applying the write voltage across the at least one cell for a write pulse time.

9. The method as recited in claim 1, wherein the at least one cell is a non-volatile polymer ferroelectric memory cell.

10. An apparatus comprising:
    a memory array;
    a temperature sensor to sense an operating temperature of the memory array; and
    an array access controller to adjust one or more memory access parameters according to the operating temperature of the memory array and to access at least one cell of the memory array using the one or more memory access parameters;
    wherein the array access controller comprises:
    a drive voltage determination unit to decrease a drive voltage applied to the at least one cell as the operating temperature increases above the threshold temperature.

11. The apparatus as recited in claim 10, wherein the array access controller further comprises:
    a pulse width determination unit to increase a pulse width of the drive voltage applied to the at least one cell as the operating temperature decreases.

12. The apparatus as recited in claim 11, wherein the array access controller comprises:
    the pulse width determination unit and the drive voltage determination unit to access a table of pulse width and drive voltage pairs to select one of the pulse width and drive voltage pairs using the operational temperature.

13. The apparatus as recited in claim 10, wherein the one or more memory access parameters to be adjusted further comprise a pulse width of the drive voltage applied to the at least one cell.

14. The apparatus as recited in claim 10, wherein the array access controller is further to prevent a disturb voltage on neighboring cells from exceeding a disturb voltage threshold.

15. The apparatus as recited in claim 10, wherein the at least one cell is a non-volatile polymer ferroelectric memory cell.

16. A system comprising:
    a disk memory;
    a memory array coupled to the disk memory to cache information for the disk memory;
    a temperature sensor to sense an operating temperature of the memory array; and
    an array access controller to access the memory array and to adjust one or more memory access parameters used by the memory controller to access at least one cell of the memory array as the operating temperature of the memory array increases above a threshold temperature;
    wherein the array access controller comprises:
    a drive voltage determination unit to decrease a drive voltage applied to the at least one cell as the operating temperature increases above the threshold temperature.

17. The system as recited in claim 16, wherein the memory array is a non-volatile polymer memory.

18. The system as recited in claim 16, wherein the memory array is a non-volatile ferroelectric memory.

19. The system as recited in claim 16, wherein the array access controller comprises:
  a pulse width determination unit to increase a pulse width of the drive voltage applied to the at least one cell as the operating temperature decreases.

20. The system as recited in claim 19, wherein the array access controller comprises:
  the pulse width determination unit and the drive voltage determination unit to access a table of pulse width and drive voltage pairs to select one of the pulse width and drive voltage pairs using the operational temperature.

21. The system as recited in claim 16, wherein the one or more memory access parameters comprise a pulse width of a drive voltage applied to the at least one cell.

22. The system as recited in claim 16, wherein the array access controller is further to prevent a disturb voltage on neighboring cells from exceeding a disturb voltage threshold.

* * * * *